(12) United States Patent
Leong et al.

(10) Patent No.: US 12,057,828 B2
(45) Date of Patent: Aug. 6, 2024

(54) BIDIRECTIONAL POWER SWITCH

(71) Applicant: Infineon Technologies Austria AG, Villach (AT)

(72) Inventors: Kennith Kin Leong, Villach (AT); Leo Aichriedler, Puch (AT); Kyoung Seop Kim, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 17/961,216

(22) Filed: Oct. 6, 2022

(65) Prior Publication Data

US 2024/0120918 A1 Apr. 11, 2024

(51) Int. Cl.
*H03K 17/687* (2006.01)
(52) U.S. Cl.
CPC ................................ *H03K 17/6871* (2013.01)
(58) Field of Classification Search
CPC .................................................. H03K 17/6871
See application file for complete search history.

(56) References Cited

U.S. PATENT DOCUMENTS

| 7,164,589 | B1 * | 1/2007 | Soldano | H02M 7/217 |
| | | | | 363/21.04 |
| 7,595,680 | B2 | 9/2009 | Morita et al. | |
| 7,768,758 | B2 | 8/2010 | Maier et al. | |
| 7,825,467 | B2 | 11/2010 | Willmeroth et al. | |
| 7,852,137 | B2 | 12/2010 | Machida et al. | |

(Continued)

FOREIGN PATENT DOCUMENTS

| CN | 102640288 A | 8/2012 |
| CN | 105871365 A | 8/2016 |

(Continued)

OTHER PUBLICATIONS

"Industry's first 1200V Half Bridge Module based on GaN technology", VisIC Techologies, https://www.psma.com/sites/default/files/uploads/tech-forums-semiconductor/presentations/is012-industrys-first-1200v-half-bridge-module-based-gan-technology.pdf, Nov. 2022, pp. 1-45.

(Continued)

*Primary Examiner* — Metasebia T Retebo
(74) *Attorney, Agent, or Firm* — Murphy, Bilak & Homiller, PLLC

(57) ABSTRACT

A unidirectional power switch includes: a normally-on switch device having a normally-on gate, a source, and a drain; a normally-off switch device having a normally-off gate, a source, and a drain, the drain of the normally-off switch device being electrically connected to the source of the normally-on switch device in a cascode configuration; a first source terminal electrically connected to the source of the normally-off switch device; a second source terminal electrically connected to the source of the normally-on switch device; and a drain terminal electrically connected to the drain of the normally-on switch device. The unidirectional power switch is configurable as either a normally-off unidirectional switch or a normally-on unidirectional switch, depending on a configuration of external gate driver connections to the source terminals. Additional power switch embodiments and related methods of configuring the power switches are described, including a configurable bidirectional power switch.

20 Claims, 4 Drawing Sheets

(56) References Cited

U.S. PATENT DOCUMENTS

| | | | |
|---|---|---|---|
| 7,868,353 | B2 | 1/2011 | Machida et al. |
| 7,875,907 | B2 | 1/2011 | Honea et al. |
| 8,344,424 | B2 | 1/2013 | Suh et al. |
| 8,487,667 | B2 | 7/2013 | Iwamura |
| 8,604,512 | B2 | 12/2013 | Morita |
| 8,649,198 | B2 | 2/2014 | Kuzumaki et al. |
| 8,664,690 | B1 | 3/2014 | Chen et al. |
| 9,276,569 | B2 | 3/2016 | Ikeda |
| 9,443,845 | B1 | 9/2016 | Stafanov et al. |
| 10,224,924 | B1 | 3/2019 | Leong |
| 10,411,698 | B2 | 9/2019 | Sato et al. |
| 10,784,853 | B2 | 9/2020 | Leong |
| 10,979,032 | B1 | 4/2021 | Leong et al. |
| 11,088,688 | B2 | 8/2021 | Pala |
| 2006/0145744 | A1 | 7/2006 | Diorio et al. |
| 2009/0167411 | A1* | 7/2009 | Machida ............ H01L 27/0605 327/427 |
| 2009/0206363 | A1 | 8/2009 | Machida et al. |
| 2010/0155775 | A1 | 6/2010 | Gauthier et al. |
| 2012/0217542 | A1 | 8/2012 | Morita |
| 2012/0262220 | A1 | 10/2012 | Springett |
| 2012/0287688 | A1* | 11/2012 | Fornage ............... H03K 17/693 327/429 |
| 2014/0145208 | A1 | 5/2014 | Rose et al. |
| 2014/0197448 | A1 | 7/2014 | Galy et al. |
| 2014/0203289 | A1 | 7/2014 | Liu et al. |
| 2014/0264431 | A1 | 9/2014 | Lal |
| 2014/0374766 | A1 | 12/2014 | Bahl et al. |
| 2015/0043116 | A1 | 2/2015 | Weyers et al. |
| 2015/0180469 | A1 | 6/2015 | Kim |
| 2015/0256163 | A1 | 9/2015 | Weis |
| 2016/0079233 | A1 | 3/2016 | Deboy et al. |
| 2016/0322485 | A1* | 11/2016 | Padmanabhan ..... H01L 29/7786 |
| 2017/0047841 | A1 | 2/2017 | Zojer et al. |
| 2017/0062419 | A1 | 3/2017 | Rose et al. |
| 2017/0103978 | A1 | 4/2017 | Prechtl et al. |
| 2017/0338809 | A1 | 11/2017 | Stefanov et al. |
| 2018/0219008 | A1 | 8/2018 | Prechtl et al. |
| 2019/0068181 | A1 | 2/2019 | Leong |
| 2019/0199289 | A1 | 6/2019 | Wei et al. |
| 2019/0252921 | A1 | 8/2019 | Lethellier et al. |
| 2019/0326280 | A1 | 10/2019 | Imam et al. |
| 2020/0098745 | A1 | 3/2020 | Roig-Guitart |
| 2020/0287536 | A1 | 9/2020 | Udrea et al. |
| 2022/0157981 | A1 | 5/2022 | Gupta et al. |
| 2022/0262960 | A1 | 8/2022 | Schiele et al. |

FOREIGN PATENT DOCUMENTS

| | | |
|---|---|---|
| EP | 3249815 A1 | 11/2017 |
| TW | 200541073 A | 12/2005 |
| WO | 2005002054 A1 | 1/2005 |
| WO | 2017159559 A1 | 9/2017 |
| WO | 2021206065 A1 | 10/2021 |

OTHER PUBLICATIONS

Chen, Ren-Yi, et al., "Study and Implementation of a Current-Fed Full-Bridge Boost DC-DC Converter With Zero-Current Switching for High-Voltage Applications", IEEE Transactions on Industry Applications, vol. 44, No. 4, Jul./Aug. 2008, 1218-1226.

Chowdhury, Dilder, "GaN FETs: Why cascode?", Sep. 30, 2020, pp. 1-6.

Friedli, Thomas, et al., Design and Performance of a 200-kHz All-SiC JFET Current DC-Link Back-to-Back Converter, IEEE Transactions on Industry Applications, vol. 45, No. 5, Sep./Oct. 2009, 1868-1878.

Huber, Jonas Emanuel, "Automatic Reverse Blocking Bidirectional Switch", U.S. Appl. No. 17/542,660, filed Dec. 6, 2021.

Kolar, J.W., et al., "Novel Three-Phase AC-DC-AC Sparse Matrix Converter", IEEE, 2002, 777-787.

Lindemann, A., "A New IGBT with Reverse Blocking Capability", Entwurf fuer EPE Conference, European Conference on Power Electronics and Applications, Graz, Austria, 2001, Posted to Internet on Sep. 11, 2014, 2001, pp. 1-7.

Siemaszko, Daniel, et al., "Active Self-Switching Methods for Emerging Monolithic Bidirectional Switches Applied to Diode-Less Converters", 2009 13th European Conference on Power Electronics and Applications, Sep. 8-10, 2009, 1-9.

Soeiro, Thiago B., et al., "Three-Phase Modular Multilevel Current Source Rectifiers For Electric Vehicle Battery Charging Systems", IEEE, 2013, 623-629.

Haehre, K., et al., "Switching Speed-Control of an Optimized Capacitor-Clamped Normally-On Silicon Carbide JFET Cascode", 15th International Power Electronics and Motion Control Conference, EPE-PEMC 2012 ECCE Europe, Novi Sad, Serbia, Sep. 4, 2012, pp. DSla.11-1-DSla.11-5.

Oladele, Olanrewaju Kabir, et al., "Optimizing Switching Performance of Cascade-Light SiC JFET Bidirectional Switch for Matrix Converter", IEEE International Power Electronics and Application Conference and Exposition (PEAC), 2018, pp. 1-6.

Li, Xueqing, et al., "Medium Voltage Power Module Based on SiC JFETs", IEEE Applied Power Electronics Conference and Exposition (APEC), Mar. 26, 2017, pp. 3033-3037.

* cited by examiner

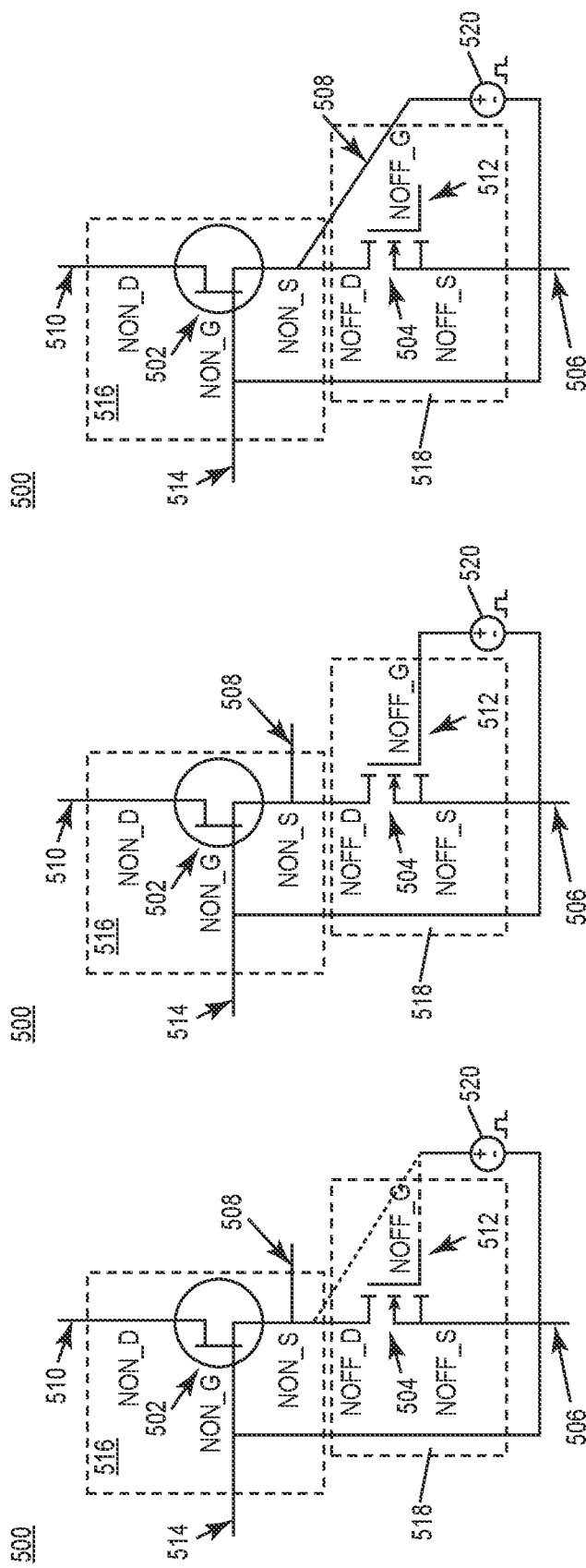

BIDIRECTIONAL POWER SWITCH

BACKGROUND

Due to their nature, conventional electro-mechanical relays can be easily implemented to provide either a normally-on or normally-off default state. In multiple implementations, even both default states are provided by one and the same component by providing two outputs. This way user-configurable default states are enabled by connecting the respective outputs of the relay. Solid-state switches implemented with either a defined normally-on or normally-off behavior are not user-configurable for either behavior. Hence, it is difficult to replace conventional electro-mechanical relays with solid-state switches. Different types of bidirectional switches (BDS) can be integrated in a single die (chip), but the die size increases depending on how many different types (configurations) are needed. For example, a normally-on BDS and a normally-off BDS may be integrated in the same die and connected for the desired configuration, but the resulting die size would be large since two (2) BDSs are integrated in the same die.

Hence, there is a need for a solid-state power switch which is user-configurable for normally-on or normally-off behavior.

SUMMARY

According to an embodiment of a bidirectional power switch, the bidirectional power switch comprises: a normally-on bidirectional switch device having a first normally-on gate, a second normally-on gate, a first source, and a second source; a first normally-off switch device having a normally-off gate, a source, and a drain; a second normally-off switch device having a normally-off gate, a source, and a drain, wherein the drain of the first normally-off switch device is electrically connected to the first source of the normally-on bidirectional switch device and the drain of the second normally-off switch device is electrically connected to the second source of the normally-on bidirectional switch device in a cascode configuration; a first source terminal electrically connected to the source of the first normally-off switch device; a second source terminal electrically connected to the source of the second normally-off switch device; a third source terminal electrically connected to the first source of the normally-on bidirectional switch device; and a fourth source terminal electrically connected to the second source of the normally-on bidirectional switch device, wherein the bidirectional power switch is configurable as either a normally-off bidirectional switch, a normally-on bidirectional switch, or a hybrid bidirectional switch, depending on a configuration of external gate driver connections to the source terminals.

According to an embodiment of a unidirectional power switch, the unidirectional power switch comprises: a normally-on switch device having a normally-on gate, a source, and a drain; a normally-off switch device having a normally-off gate, a source, and a drain, wherein the drain of the normally-off switch device is electrically connected to the source of the normally-on switch device in a cascode configuration; a first source terminal electrically connected to the source of the normally-off switch device; a second source terminal electrically connected to the source of the normally-on switch device; and a drain terminal electrically connected to the drain of the normally-on switch device, wherein the unidirectional power switch is configurable as either a normally-off unidirectional switch or a normally-on unidirectional switch, depending on a configuration of external gate driver connections to the source terminals.

According to a method of configuring a bidirectional power switch, the method comprises: attaching the bidirectional power switch to a circuit board, the bidirectional power switch including: a normally-on bidirectional switch device having a first normally-on gate, a second normally-on gate, a first source, and a second source; a first normally-off switch device having a normally-off gate, a source, and a drain; a second normally-off switch device having a normally-off gate, a source, and a drain, wherein the drain of the first normally-off switch device is electrically connected to the first source of the normally-on bidirectional switch device and the drain of the second normally-off switch device is electrically connected to the second source of the normally-on bidirectional switch device in a cascode configuration; a first source terminal electrically connected to the source of the first normally-off switch device; a second source terminal electrically connected to the source of the second normally-off switch device; a third source terminal electrically connected to the first source of the normally-on bidirectional switch device; and a fourth source terminal electrically connected to the second source of the normally-on bidirectional switch device; and configuring the bidirectional power switch as one of: a normally-off bidirectional switch, by connecting outputs of a first gate driver between the first source terminal and the gate of the first normally-off switch device and connecting outputs of a second gate driver between the second source terminal and the gate of the second normally-off switch device; a normally-on bidirectional switch, by connecting the outputs of the first gate driver between the first source terminal and the third source terminal and connecting the outputs of the second gate driver between the second source terminal and the fourth source terminal; or a hybrid bidirectional switch, by connecting the outputs of the first gate driver between the first source terminal and the gate of the first normally-off switch device and connecting the outputs of the second gate driver between the second source terminal and the fourth source terminal.

According to a method of configuring a unidirectional power switch, the method comprises: attaching the unidirectional power switch to a circuit board, the unidirectional power switch including: a normally-on switch device having a normally-on gate, a source, and a drain; a normally-off switch device having a normally-off gate, a source, and a drain, wherein the drain of the normally-off switch device is electrically connected to the source of the normally-on switch device in a cascode configuration; a first source terminal electrically connected to the source of the normally-off switch device; a second source terminal electrically connected to the source of the normally-on switch device; and a drain terminal electrically connected to the drain of the normally-on switch device; and configuring the unidirectional power switch as one of: a normally-off unidirectional switch, by connecting outputs of a gate driver between the first source terminal and the gate of the first normally-off switch device; or a normally-on unidirectional switch, by connecting the outputs of the gate driver between the first source terminal and the second source terminal.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments may be combined unless they exclude each other. Embodiments are depicted in the drawings and are detailed in the description that follows.

FIG. 7 illustrates a circuit schematic of an embodiment of a solid-state unidirectional power switch.

FIG. 8 illustrates the solid-state unidirectional power switch of FIG. 7 configured as a normally-off unidirectional switch.

FIG. 9 illustrates the solid-state unidirectional power switch of FIG. 7 configured as a normally-on unidirectional switch.

DETAILED DESCRIPTION

The embodiments described herein provide bidirectional and unidirectional solid-state switches which are user-configurable for normally-on or normally-off behavior. One example of such a configurable solid-state switch is a bidirectional power switch that is configurable as either a normally-off bidirectional switch, a normally-on bidirectional switch, or a hybrid bidirectional switch, depending on a configuration of external gate driver connections to the source terminals of the bidirectional power switch. Another example of such a configurable solid-state switch is a unidirectional power switch that is configurable as either a normally-off unidirectional switch or a normally-on unidirectional switch, depending on a configuration of external gate driver connections to the source terminals of the unidirectional power switch. Corresponding methods of configuring the solid-state switches are also provided.

Described next, with reference to the figures, are exemplary embodiments of the configurable solid-state switches and related configuration methods.

Figure 1:
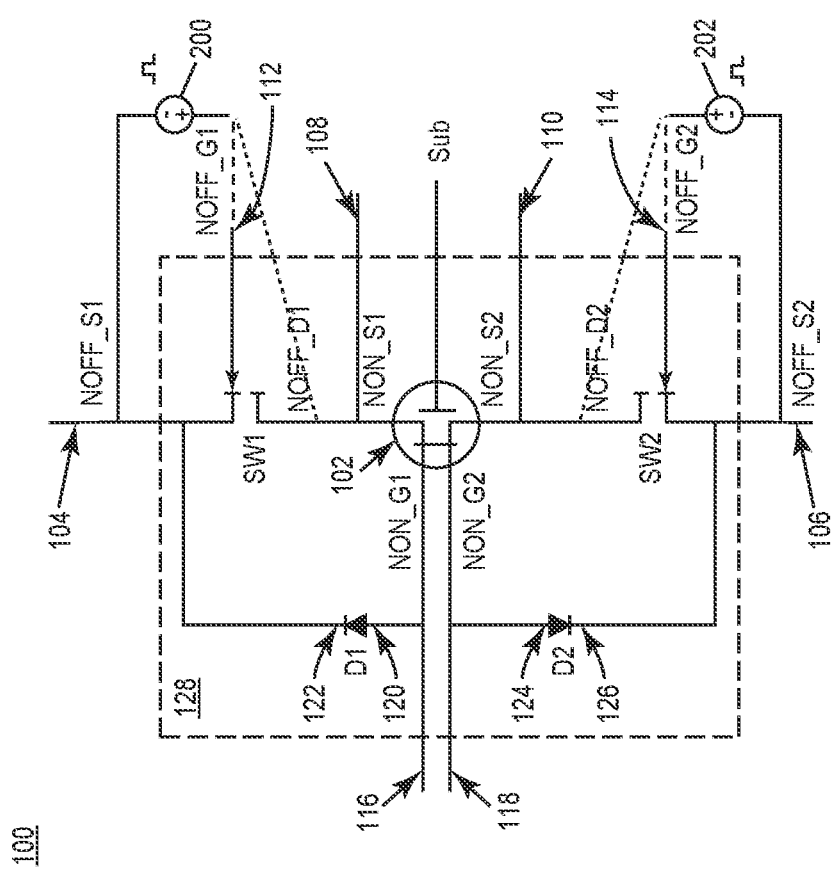
FIG. 1 illustrates a circuit schematic of an embodiment of a solid-state bidirectional power switch.

FIG. 1 illustrates an embodiment of a solid-state bidirectional power switch 100. The bidirectional power switch 100 has bidirectional current flow capability when turned on and provides bidirectional voltage blocking when turned off. The bidirectional power switch 100 may be used in any number of power electronics circuits that use bidirectional switches. For example, the bidirectional power switch 100 may be used as a solid-state relay. The bidirectional power switch 100 may be used as an overcurrent and/or overvoltage protection switch for battery management systems, fuel-cell generators, etc. The bidirectional power switch 100 may be used inside the topology of power converter such as a T-type converter, dual-active bridge, etc.

The bidirectional power switch 100 includes a normally-on bidirectional switch device 102, a first normally-off switch device SW1, and a second normally-off switch device SW2. The normally-on bidirectional switch device 102 has a first normally-on gate 'NON_G1', a second normally-on gate 'NON_G2', a first source 'NON_S1', and a second source 'NON_S2'. The first normally-off switch device SW1 has a normally-off gate 'NOFF_G1', a source 'NOFF_S1', and a drain 'NOFF_D1'. The second normally-off switch device SW2 has a normally-off gate 'NOFF_G2', a source 'NOFF_S2', and a drain 'NOFF_D2'. For a normally-on gate, a current conduction channel is present adjacent the gate absent any voltage being applied to the gate. For a normally-off gate, a current conduction channel is not present adjacent the gate without a suitable voltage applied to the gate.

The drain NOFF_D1 of the first normally-off switch device SW1 is electrically connected to the first source NON_S1 of the normally-on bidirectional switch device 102 and the drain NOFF_D2 of the second normally-off switch device SW2 is electrically connected to the second source NON_S2 of the normally-on bidirectional switch device 102 in a cascode configuration. FIG. 1 also shows a terminal connection 'Sub' to the substrate for the normally-on bidirectional switch device 102.

A first source terminal 104 of the bidirectional power switch 100 is electrically connected to the source NOFF_S1 of the first normally-off switch device SW1. A second source terminal 106 of the bidirectional power switch 100 is electrically connected to the source NOFF_S2 of the second normally-off switch device SW2. A third source terminal 108 of the bidirectional power switch 100 is electrically connected to the first source NON_S1 of the normally-on bidirectional switch device 102. A fourth source terminal 110 of the bidirectional power switch 100 is electrically connected to the second source NON_S2 of the normally-on bidirectional switch device 102.

A first gate terminal 112 of the bidirectional power switch 100 is electrically connected to the normally-off gate NOFF_G1 of the first normally-off switch device SW1. A second gate terminal 114 of the bidirectional power switch 100 is electrically connected to the normally-off gate NOFF_G2 of the second normally-off switch device SW2. The bidirectional power switch 100 may include a third gate terminal 116 that is electrically connected to the first normally-on gate G1 of the normally-on bidirectional switch device 102 and a fourth gate terminal 118 that is electrically connected to the second normally-on gate G2 of the normally-on bidirectional switch device 102.

The conducting or non-conducting state of the first normally-on gate G1 of the normally-on bidirectional switch device 102 is determined by the potential difference between the source NOFF_S1 of the first normally-off switch device SW1 and the first source NON_S1 of the normally-on bidirectional switch device 102. The conducting or non-conducting state of the second normally-on gate G2 of the normally-on bidirectional switch device 102 is likewise determined by the potential difference between the source NOFF_S2 of the second normally-off switch device SW2 and the second source NON_S2 of the normally-on bidirectional switch device 102. Accordingly, the bidirectional power switch 100 may include the third and fourth gate terminals 116, 118, e.g., for observation of the normally-on gates G1, G2 of the normally-on bidirectional switch device 102, or the third and fourth gate terminals 116, 118 may be omitted.

In one embodiment, the first normally-on gate G1 of the normally-on bidirectional switch device 102 is electrically connected to the source NOFF_S1 of the first normally-off switch device SW1 by a first diode D1 and the second normally-on gate G2 of the normally-on bidirectional switch device 102 is electrically connected to the source NOFF_S2 of the second normally-off switch device SW2 by a first diode D2. The first diode D1 has an anode 120 electrically connected to the first normally-on gate G1 of the normally-on bidirectional switch device 102 and a cathode 122 electrically connected to the source NOFF_S1 of first normally-off switch device SW1. The second diode D2 has an anode 124 electrically connected to the second normally-on gate G2 of the normally-on bidirectional switch device 102 and a cathode 126 electrically connected to the source NOFF_S2 of second normally-off switch device SW2.

The bidirectional power switch 100 is configurable as either a normally-off bidirectional switch, a normally-on bidirectional switch, or a hybrid bidirectional switch, depending on a configuration of external gate driver connections to the source terminals 104, 106, 108, 110 of the four-source terminal bidirectional power switch 100. According to this embodiment, only a single bidirectional switch device 102 and two (2) normally-off switch devices SW1, SW2 are used to implement the bidirectional power switch 100 and two external gate drivers 200, 202 are used to configure the bidirectional power switch 100 as either a normally-off bidirectional switch, a normally-on bidirectional switch, or a hybrid bidirectional switch. The external gate driver connection options for configuring the bidirectional power switch 100 as either a normally-off bidirectional switch, a normally-on bidirectional switch, or a hybrid bidirectional switch are illustrated as dashed lines in FIG. 1.

Figure 2:
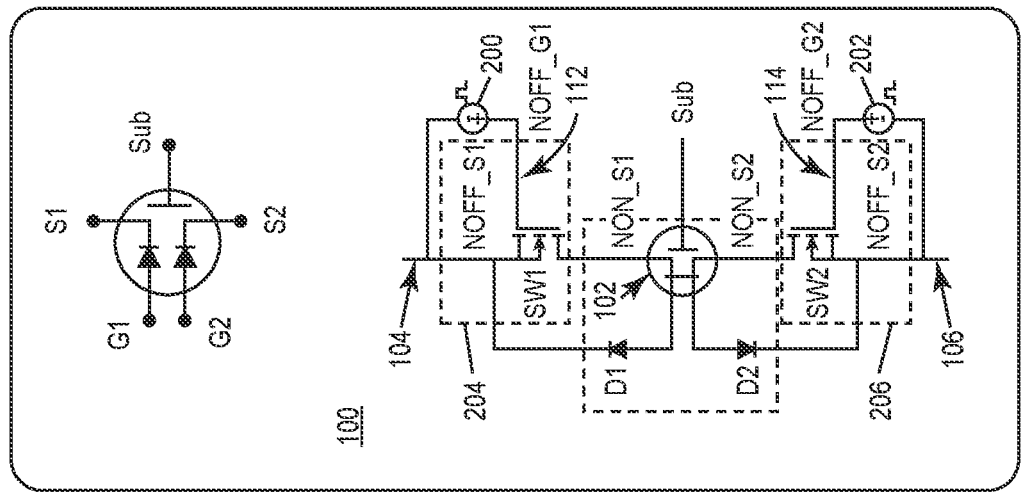
FIG. 2 illustrates the solid-state bidirectional power switch of FIG. 1 configured as a normally-off bidirectional switch.

FIG. 2 shows the bidirectional power switch 100 configured as a normally-off bidirectional switch. The lower part of FIG. 2 shows the external gate driver connections for configuring the bidirectional power switch 100 as a normally-off bidirectional switch. The upper part of FIG. 2 shows the equivalent symbol of the normally-off bidirectional switch as a four-terminal device with two (2) gate terminals G1, G2 and two (2) source terminals S1, S2 plus the substrate connection 'Sub'. The source terminals S1, S2 in the upper part of FIG. 2 correspond to the first and second source terminals 104, 106 of the bidirectional power switch 100 which are electrically connected to the sources NOFF_S1, NOFF_S2 of the first and second normally-off switch devices SW1, SW2, respectively. The gate terminals G1, G2 in the upper part of FIG. 2 correspond to the first and second gate terminals 112, 114 of the bidirectional power switch 100 which are electrically connected to the gates NOFF_G1, NOFF_G2 of the first and second normally-off switch devices SW1, SW2, respectively.

According to this embodiment, the bidirectional power switch is configurable as a normally-off bidirectional switch by connecting the outputs of a first gate driver 200 between the first source terminal 104 of the bidirectional power switch 100 and the gate NOFF_G1 of the first normally-off switch device SW1 via the first gate terminal 112 of the bidirectional power switch 100, and by connecting the outputs of a second gate driver 202 between the second source terminal 106 of the bidirectional power switch 100 and the gate NOFF_G2 of the second normally-off switch device SW2 via the second gate terminal 114 of the bidirectional power switch 100. Current flows through the normally-on bidirectional switch device 102 when the first gate driver 200 turns on the first normally-off switch device SW1 and the second gate driver 202 turns on the second normally-off switch device SW2. The third and fourth gate terminals 116, 118 are omitted from the bidirectional power switch 100 in FIG. 2.

Figure 3:
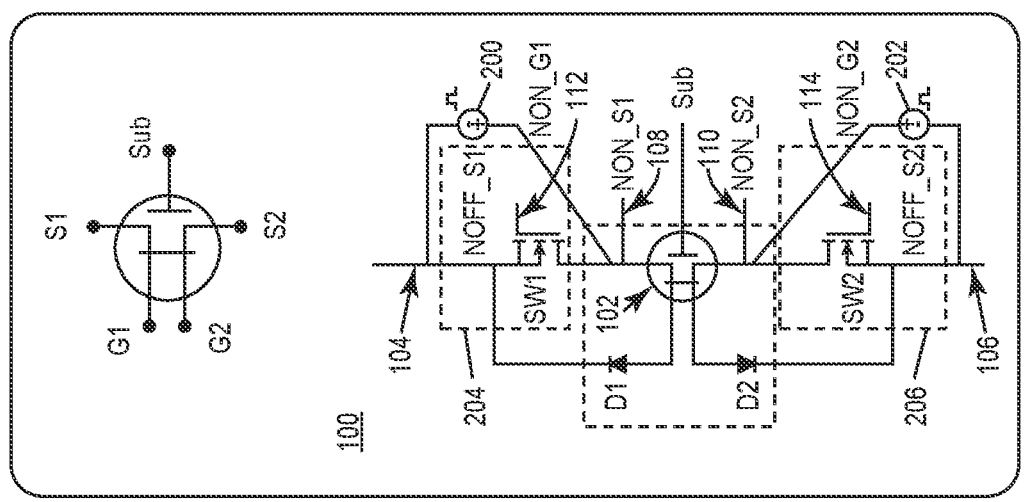
FIG. 3 illustrates the solid-state bidirectional power switch of FIG. 1 configured as a normally-on bidirectional switch.

FIG. 3 shows the bidirectional power switch 100 configured as a normally-on bidirectional switch. The lower part of FIG. 3 shows the external gate driver connections for configuring the bidirectional power switch 100 as a normally-on bidirectional switch. The upper part of FIG. 3 shows the equivalent symbol of the normally-on bidirectional switch as a four-terminal device with two (2) gate terminals G1, G2 and two (2) source terminals S1, S2 plus the substrate connection 'Sub'. The source terminals S1, S2 in the upper part of FIG. 3 correspond to the first and second source terminals 108, 110 of the bidirectional power switch 100 which are electrically connected to the sources NON_S1, NON_S2 of the normally-on bidirectional switch device 102. The gate terminals G1, G2 in the upper part of FIG. 3 correspond to the first and second source terminals 100 104, 106 of the normally-on bidirectional power switch 102.

According to this embodiment, the bidirectional power switch 100 is configurable as a normally-on bidirectional switch by connecting the outputs of the first gate driver 200 between the first source terminal 104 and the third source terminal 108 of the bidirectional power switch 100, and by connecting the outputs of the second gate driver 202 between the second source terminal 106 and the fourth source terminal 110 of the bidirectional power switch 100.

The gates NOFF_G1, NOFF_G2 of the normally-off switch devices SW1, SW2 are not driven in this embodiment, with current flowing only through the normally-on bidirectional switch device 102 and not through either normally-off switch device SW1, SW2. Accordingly, the corresponding gate terminals 112, 114 of the bidirectional power switch 100 may be externally accessible but no connections are made to these gate terminals 112, 114 in this embodiment. Each gate NON_G1, NON_G2 of the normally-on bidirectional switch device 102 may be turned off by applying a negative voltage in reference to the respective gate NON_G1, NON_G2, which is connected to the corresponding gate driver 200, 202 through a diode D1, D2. The diodes D1, D2 may be reverse gate diodes integrated into the normally-on bidirectional switch device 102, for example.

Figure 4:
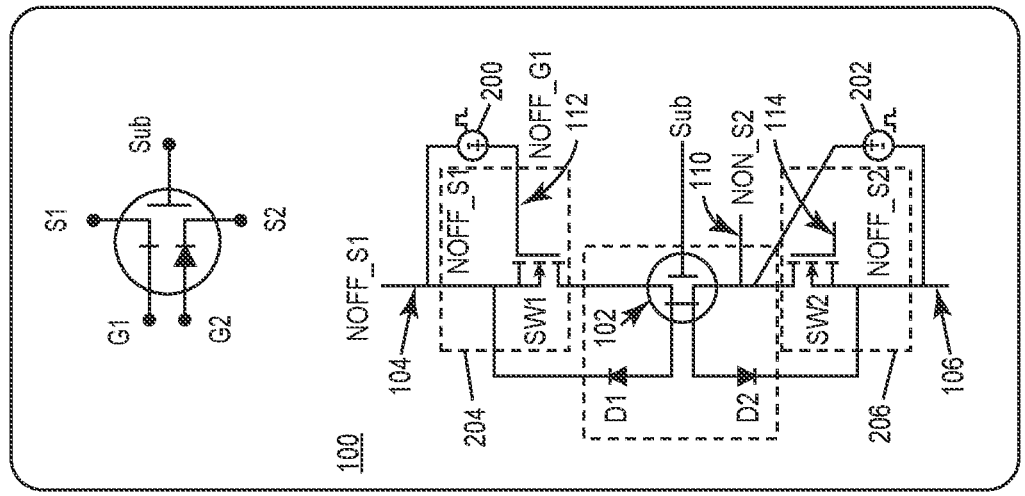
FIG. 4 illustrates the solid-state bidirectional power switch of FIG. 1 configured as a hybrid bidirectional switch.

FIG. 4 shows the bidirectional power switch 100 configured as a hybrid bidirectional switch. Unlike the symmetric normally-off bidirectional switch of FIG. 2 which has two normally-off gates or the symmetric normally-on bidirectional switch of FIG. 3 which has two normally-on gates, the hybrid bidirectional switch in FIG. 4 is an asymmetrical bidirectional switch in that one gate (G2) is normally-on (i.e., depletion mode) and the other gate (G1) is normally-off gate (i.e., enhancement mode). The lower part of FIG. 4 shows the external gate driver connections for configuring the bidirectional power switch 100 as a hybrid bidirectional switch. The upper part of FIG. 4 shows the equivalent symbol of the hybrid bidirectional switch as a four-terminal device with two (2) gate terminals G1, G2 and two (2) source terminals S1, S2 plus the substrate connection 'Sub'. The source terminals S1, S2 in the upper part of FIG. 4 correspond to the first and second source terminals 104, 110 of the bidirectional power switch 100 which are electrically connected to the source NOFF_S1 of the first normally-off switch device SW1 and the second source NON_S2 of the normally-on bidirectional switch device 102, respectively. Gate terminal G1 in the upper part of FIG. 4 corresponds to the second source terminal 106 of the bidirectional power switch 100 which is electrically coupled to the gate NON_G2 of the normally-on bidirectional switch device 102. Gate terminal G2 in the upper part of FIG. 4 corresponds to the first gate terminal 112 of the bidirectional power switch 100 which is electrically coupled to the gate first normally off switch device SW1, NOFF_G1. According to this embodiment, the bidirectional power switch 100 is configurable as a hybrid bidirectional switch by connecting the outputs of the first gate driver 200 between the first source terminal 104 of the bidirectional power switch 100 and the gate NOFF_G1 of the first normally-off switch device SW1 via the first gate terminal 112 of the bidirectional power switch 100, and by connecting the outputs of the second gate driver 202 between the second source terminal 106 and the fourth source terminal 110 of the bidirectional power switch 100. The hybrid bidirectional switch embodiment is a combination of the normally-off bidirectional switch embodiment of FIG. 2 and the normally-on bidirectional switch embodiment of FIG. 3.

For each of the normally-off, normally-on, and hybrid bidirectional switch embodiments shown in FIGS. 2 through 4, the normally-on bidirectional switch device 102 may have a breakdown voltage of 600V or higher and both the first diode D1 and the second diode D2 may have a breakdown voltage of 20V or less. For example, the normally-on bidirectional switch device 102 may be a bidirectional GaN HEMT (high-electron mobility transistor), the first normally-off switch device SW1 may be a Si power MOSFET (metal-oxide-semiconductor field-effect transistor), and the second normally-off switch device SW2 also may be a Si power MOSFET. The bidirectional GaN HEMT may be a bidirectional gate injection transistor (GIT) such as a hybrid-drain HEMT with a p-GaN gate, for example.

The normally-on bidirectional switch device 102, the first diode D1, and the second diode D2 may be integrated in the same GaN semiconductor die 128, e.g., as shown in FIG. 1. The first and second normally-off switch devices SW1, SW2 may be normally-off GaN HEMTs integrated in the same GaN semiconductor die 128 as the normally-on bidirectional switch device 102 and diodes D1, D2, e.g., also as shown in FIG. 1.

In another embodiment, the normally-on bidirectional switch device 102 may be disposed in a first die 128 that comprises GaN, the first normally-off switch device SW1 may be disposed in a second die 204 that comprises GaN or Si, and the second normally-off switch device SW2 may be disposed in a third die 206 that comprises GaN or Si, e.g., as shown in FIGS. 2 through 4. In the case of Si power MOSFETs as the first and second normally-off switch devices SW1, SW2, both the second die 204 and the third die 206 comprise Si. In the case of normally-off GaN HEMTs as the first and second normally-off switch devices SW1, SW2, both the second die 204 and the third die 206 comprise GaN. In either case, the three (3) dies 128, 204, 206 may be integrated in the same molded package 300, e.g., as shown in FIG. 5.

Figure 5:
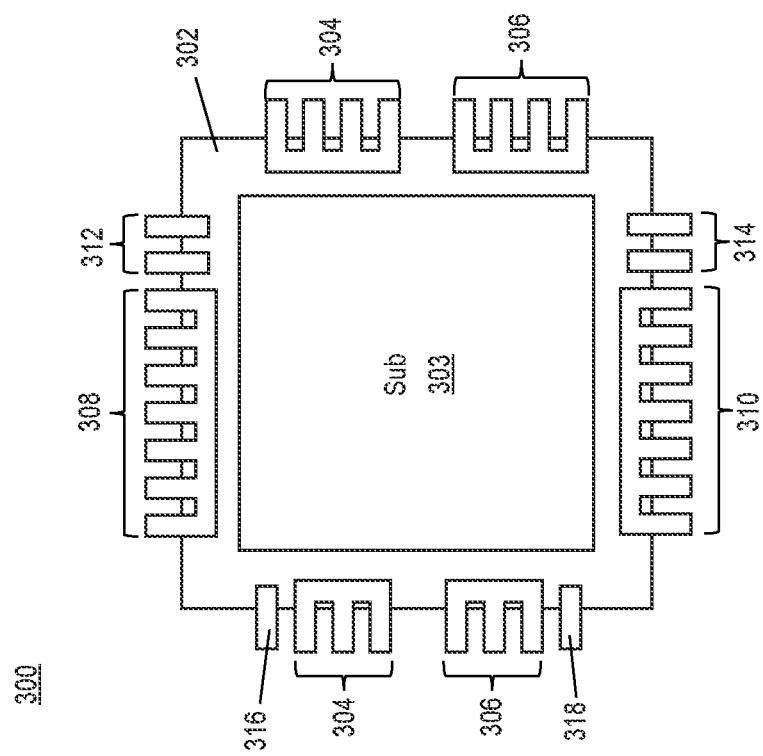
FIG. 5 illustrates a bottom plan view of a molded package that includes the solid-state bidirectional power switch of FIG. 1.

FIG. 5 illustrates a bottom plan view of the molded package 300, where each die 128, 204, 206 is embedded in a mold compound 302. The molded package 300 may include an exposed metal lead/pad 303 electrically connected to the substrate 'Sub' of the normally-on bidirectional switch device 102. The molded package 300 may also include at least one first metal lead/terminal 304 electrically connected to the first source NON_S1 of the normally-on bidirectional switch device 102, at least one second metal lead/terminal 306 electrically connected to the first source NON_S1 of the normally-on bidirectional switch device 102, at least one third metal lead/terminal 308 electrically connected to the source NOFF_S1 of the first normally-off switch device SW1, at least one fourth metal lead/terminal 310 electrically connected to the source NOFF_S2 of the second normally-off switch device SW2, at least one fifth metal lead/terminal 312 electrically connected to the gate NOFF_G1 of the first normally-off switch device SW1, at least one sixth metal lead/terminal 314 electrically connected to the gate NOFF_G2 of the second normally-off switch device SW2. The molded package 300 may further include the third and fourth gate leads/terminals 316, 318 electrically connected to the normally-on gates G1, G2, respectively, of the normally-on bidirectional switch device 102. The third and fourth gate leads/terminals 316, 318 may be omitted since the normally-on gates G1, G2 of the normally-on bidirectional switch device 102 are not actively driven by a gate driver, as previously explained herein. However, the third and fourth gate leads/terminals 316, 318 may be used for (electrically) observing the normally-on gates G1, G2 of the normally-on bidirectional switch device 102.

Figure 6:
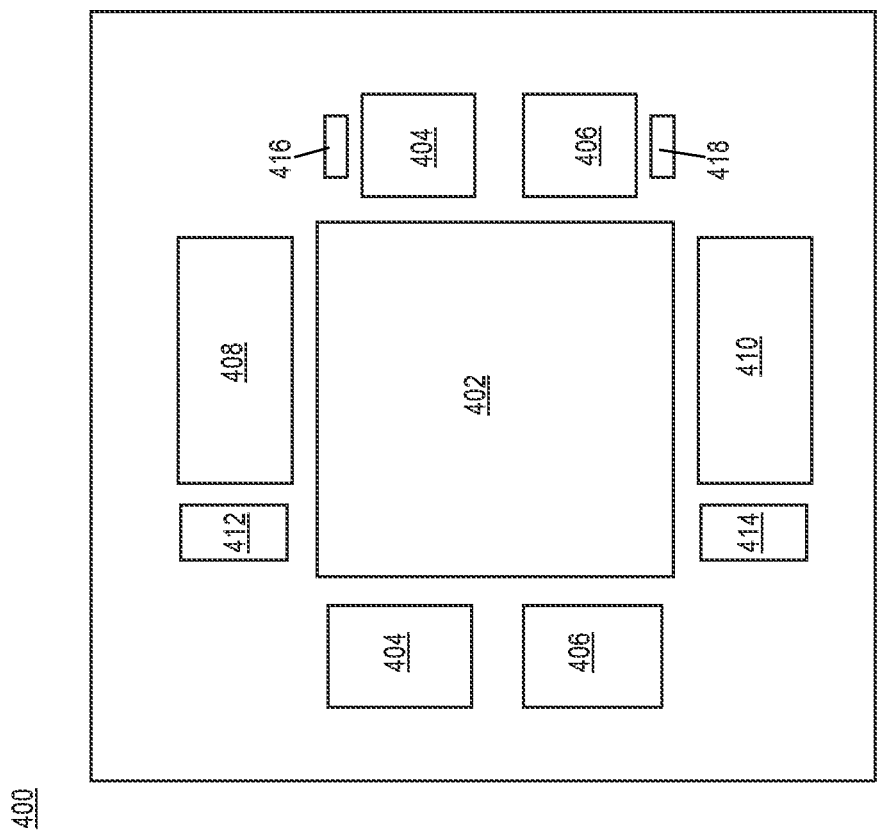
FIG. 6 illustrates a top plan view of a circuit board to which the molded package of FIG. 5 can be attached.

FIG. 6 illustrates a top plan view of a circuit board such as a printed circuit board (PCB) 400 to which the molded package 300 can be attached. The circuit board 400 may be, e.g., a single-layer or multi-layer PCB and includes a first metal trace 402 for connecting to the exposed metal lead/pad 303 of the molded package 300, a second metal trace 404 for connecting to the first metal lead/terminal 304 of the molded package 300, a third metal trace 406 for connecting to the second metal lead/terminal 306 of the molded package 300, a fourth metal trace 408 for connecting to the third metal lead/terminal 308 of the molded package 300, a fifth metal trace 410 for connecting to the fourth metal lead/terminal 310 of the molded package 300, a sixth metal trace 412 for connecting to the fifth metal lead/terminal 312 of the molded package 300, a seventh metal trace 414 for connecting to the sixth metal lead/terminal 314 of the molded package 300, an eighth metal trace 416 for connecting to the seventh metal lead/terminal 316 of the molded package 300, and a ninth metal trace 418 for connecting to the eight metal lead/terminal 318 of the molded package 300, e.g., by solder, electrically conductive adhesive, etc.

To configure the bidirectional power switch included in the molded package 300 as a normally-off bidirectional switch as shown in FIG. 2, the first gate driver 200 is connected between the fourth metal trace 408 and the sixth metal trace 412 of the circuit board 400 and the second gate driver 202 is connected between the fifth metal trace 410 and the seventh metal trace 414 of the circuit board.

To configure the bidirectional power switch included in the molded package 300 as a normally-on bidirectional switch as shown in FIG. 3, the first gate driver 202 is connected between the second metal trace 404 and the fourth metal trace 408 of the circuit board 400 and the second gate driver 202 is connected between the third metal trace 406 and the fifth metal trace 410 of the circuit board 400.

To configure the bidirectional power switch included in the molded package 300 as a hybrid bidirectional switch as shown in FIG. 4, the first gate driver 200 is connected between the fourth metal trace 408 and the sixth metal trace 412 of the circuit board 400 and the second gate driver 202 is connected between the third metal trace 406 and the fifth metal trace 410 of the circuit board 400.

Described next are embodiments of a unidirectional solid-state switch which is user-configurable for normally-on or normally-off behavior.

FIG. 7 illustrates an embodiment of a solid-state unidirectional power switch 500. The unidirectional power switch 500 has bidirectional current flow capability when turned on and provides unidirectional voltage blocking when turned off. The unidirectional power switch 500 may be used in any number of power electronics circuits that use a high-side switch or low-side switch of a power converter such as an SMPS (switched mode power supply), etc.

The unidirectional power switch 500 includes a normally-on switch device 502 and a normally-off switch device 504. The normally-on switch device 502 has a normally-on gate 'NON_G', a source 'NON_S', and a drain 'NON_D'. The normally-off switch device 504 has a normally-off gate 'NOFF_G', a source 'NOFF_S', and a drain 'NOFF_D'. The drain NOFF_D of the normally-off switch device 504 is electrically connected to the source NON_S of the normally-on switch device 502 in a cascode configuration.

A first source terminal 506 of the unidirectional power switch 500 is electrically connected to the source NOFF_S of the normally-off switch device 504. A second source terminal 508 of the unidirectional power switch 500 is electrically connected to the source NON_S of the normally-on switch device 502. A drain terminal 510 of the unidirectional power switch 500 is electrically connected to the drain NON_D of the normally-on switch device 502. A first gate terminal 512 of the unidirectional power switch 500 is electrically connected to the normally-off gate NOFF_G of the normally-off switch device 504. The unidirectional power switch 500 may include a second gate terminal 514 which is electrically the same node as the first source terminal 506 of the unidirectional power switch 500, e.g., for observation of the normally-on gate NON_G of the normally-on switch device 502, or the second gate terminal 514 may be omitted.

In one embodiment, the normally-on switch device 502 is disposed in a GaN semiconductor die 516 and the normally-off switch device 504 is disposed in a Si semiconductor die 518. For example, the normally-on switch device 502 may be a GaN HEMT (high-electron mobility transistor) such as a GIT and the normally-off switch device 504 may be a Si power MOSFET. The GaN semiconductor die 516 and the Si semiconductor die 518 may be integrated in a same molded package for mounting to a circuit board, e.g., similar to what is shown in FIGS. 5 and 6.

The unidirectional power switch 500 is configurable as either a normally-off unidirectional switch or a normally-on unidirectional switch, depending on a configuration of external gate driver connections to the source terminals 506, 508 of the unidirectional power switch 500. According to this embodiment, only a single normally-on switch device 502 and a single normally-off switch device 504 are used to implement the unidirectional power switch 500 and a single gate driver 520 is used to configure the unidirectional power switch 500 as either a normally-off unidirectional switch or a normally-on unidirectional switch. The external gate driver connection options for configuring the unidirectional power switch 500 as either a normally-off unidirectional switch or a normally-on unidirectional switch are illustrated as dashed lines in FIG. 7.

FIG. 8 shows the unidirectional power switch 500 configured as a normally-off unidirectional switch. According to this embodiment, the unidirectional power switch 500 is configurable as a normally-off unidirectional switch by connecting the outputs of the gate driver 520 between the first source terminal 506 of the unidirectional power switch 500 and the gate NOFF_G of the normally-off switch device 504 via the first gate terminal 512 of the unidirectional power switch 500. Current flows through the normally-on switch device 502 when the gate driver 520 turns on the normally-off switch device 504. Otherwise, the unidirectional power switch 500 is blocking.

FIG. 9 shows the unidirectional power switch 500 configured as a normally-on unidirectional switch. According to this embodiment, the unidirectional power switch 500 is configurable as a normally-on unidirectional switch by connecting the outputs of the gate driver 520 between the first source terminal 506 of the unidirectional power switch 500 and the second source terminal 508 of the unidirectional power switch 500. The gate NOFF_G of the normally-off switch device 504 is not driven in this embodiment, with current flowing only through the normally-on switch device 502 and not through the normally-off switch device 504. The gate NON_G of the normally-on switch device 502 may be turned off by applying a negative voltage in reference to the gate NON_G which is connected to the gate driver 516, putting the unidirectional power switch 500 in a blocking state.

Although the present disclosure is not so limited, the following numbered examples demonstrate one or more aspects of the disclosure.

Example 1. A bidirectional power switch, comprising: a normally-on bidirectional switch device having a first normally-on gate, a second normally-on gate, a first source, and a second source; a first normally-off switch device having a normally-off gate, a source, and a drain; a second normally-off switch device having a normally-off gate, a source, and a drain, wherein the drain of the first normally-off switch device is electrically connected to the first source of the normally-on bidirectional switch device and the drain of the second normally-off switch device is electrically connected to the second source of the normally-on bidirectional switch device in a cascode configuration; a first source terminal electrically connected to the source of the first normally-off switch device; a second source terminal electrically connected to the source of the second normally-off switch device; a third source terminal electrically connected to the first source of the normally-on bidirectional switch device; and a fourth source terminal electrically connected to the second source of the normally-on bidirectional switch device, wherein the bidirectional power switch is configurable as either a normally-off bidirectional switch, a normally-on bidirectional switch, or a hybrid bidirectional switch, depending on a configuration of external gate driver connections to the source terminals.

Example 2. The bidirectional power switch of example 1, wherein the bidirectional power switch is configurable as a normally-off bidirectional switch by connecting outputs of a first gate driver between the first source terminal and the gate of the first normally-off switch device and connecting outputs of a second gate driver between the second source terminal and the gate of the second normally-off switch device.

Example 3. The bidirectional power switch of example 1, wherein the bidirectional power switch is configurable as a normally-on bidirectional switch by connecting outputs of a first gate driver between the first source terminal and the third source terminal and connecting outputs of a second gate driver between the second source terminal and the fourth source terminal.

Example 4. The bidirectional power switch of example 1, wherein the bidirectional power switch is configurable as a hybrid bidirectional switch by connecting outputs of a first gate driver between the first source terminal and the gate of the first normally-off switch device and connecting outputs of a second gate driver between the second source terminal and the fourth source terminal.

Example 5. The bidirectional power switch of any of examples 1 through 4, wherein the normally-on bidirectional switch device, the first normally-off switch device, and the second normally-off switch device are integrated in a same GaN semiconductor die.

Example 6. The bidirectional power switch of any of examples 1 through 4, wherein the normally-on bidirectional switch device is disposed in a first die that comprises GaN, the first normally-off switch device is disposed in a second die that comprises GaN or Si, and the second normally-off switch device is disposed in a third die that comprises GaN or Si, and wherein the first die, the second die, and the third die are integrated in a same molded package.

Example 7. The bidirectional power switch of any of examples 1 through 6, further comprising: a first diode having an anode electrically connected to the first normally-on gate of the normally-on bidirectional switch device and a cathode electrically connected to the source of first normally-off switch device; and a second diode having an anode electrically connected to the second normally-on gate of the normally-on bidirectional switch device and a cathode electrically connected to the source of second normally-off switch device.

Example 8. The bidirectional power switch of example 7, wherein the normally-on bidirectional switch device, the first diode, and the second diode are integrated in a same GaN semiconductor die.

Example 9. The bidirectional power switch of example 8, wherein the first normally-off switch device and the second normally-off switch device are integrated in the same GaN semiconductor die as the normally-on bidirectional switch device, the first diode, and the second diode.

Example 10. The bidirectional power switch of example 8, wherein the first normally-off switch device is disposed in a first Si semiconductor die and the second normally-off switch device is disposed in a second Si semiconductor die, and wherein the GaN semiconductor die, the first Si semiconductor die, and the second Si semiconductor die are integrated in a same molded package.

Example 11. The bidirectional power switch of any of examples 7 through 10, wherein the normally-on bidirectional switch device has a breakdown voltage of 600V or higher, and wherein both the first diode and the second diode have a breakdown voltage of 20V or less.

Example 12. The bidirectional power switch of any of examples 1 through 11, wherein the normally-on bidirectional switch device is a GaN HEMT (high-electron mobility transistor), wherein the first normally-off switch device is a Si power MOSFET (metal-oxide-semiconductor field-effect transistor), and wherein the second normally-off switch device is a Si power MOSFET.

Example 13. The bidirectional power switch of any of examples 1 through 12, further comprising: a first gate terminal electrically connected to the normally-off gate of the first normally-off switch device; a second gate terminal electrically connected to the normally-off gate of the second normally-off switch device; a third gate terminal electrically connected to the first normally-on gate of the normally-on bidirectional switch device; and a fourth gate terminal electrically connected to the second normally-on gate of the normally-on bidirectional switch device.

Example 14. A unidirectional power switch, comprising: a normally-on switch device having a normally-on gate, a source, and a drain; a normally-off switch device having a normally-off gate, a source, and a drain, wherein the drain of the normally-off switch device is electrically connected to the source of the normally-on switch device in a cascode configuration; a first source terminal electrically connected to the source of the normally-off switch device; a second source terminal electrically connected to the source of the normally-on switch device; and a drain terminal electrically connected to the drain of the normally-on switch device, wherein the unidirectional power switch is configurable as either a normally-off unidirectional switch or a normally-on unidirectional switch, depending on a configuration of external gate driver connections to the source terminals.

Example 15. The unidirectional power switch of example 14, wherein the unidirectional power switch is configurable as a normally-off unidirectional switch by connecting outputs of a gate driver between the first source terminal and the gate of the normally-off switch device.

Example 16. The unidirectional power switch of example 14, wherein the unidirectional power switch is configurable as a normally-on unidirectional switch by connecting outputs of a gate driver between the first source terminal and the second source terminal.

Example 17. The unidirectional power switch of any of examples 14 through 16, wherein the normally-on switch device is disposed in a GaN semiconductor die and the normally-off switch device is disposed in a Si semiconductor die, and wherein the GaN semiconductor die and the Si semiconductor die are integrated in a same molded package.

Example 18. The unidirectional power switch of any of examples 14 through 17, wherein the normally-on switch device is a GaN HEMT (high-electron mobility transistor), and wherein the normally-off switch device is a Si power MOSFET (metal-oxide-semiconductor field-effect transistor).

Example 19. A method of configuring a bidirectional power switch, the method comprising: attaching the bidirectional power switch to a circuit board, the bidirectional power switch including: a normally-on bidirectional switch device having a first normally-on gate, a second normally-on gate, a first source, and a second source; a first normally-off switch device having a normally-off gate, a source, and a drain; a second normally-off switch device having a normally-off gate, a source, and a drain, wherein the drain of the first normally-off switch device is electrically connected to the first source of the normally-on bidirectional switch device and the drain of the second normally-off switch device is electrically connected to the second source of the normally-on bidirectional switch device in a cascode configuration; a first source terminal electrically connected to the source of the first normally-off switch device; a second source terminal electrically connected to the source of the second normally-off switch device; a third source terminal electrically connected to the first source of the normally-on bidirectional switch device; and a fourth source terminal electrically connected to the second source of the normally-on bidirectional switch device; and configuring the bidirectional power switch as one of: a normally-off bidirectional switch, by connecting outputs of a first gate driver between the first source terminal and the gate of the first normally-off switch device and connecting outputs of a second gate driver between the second source terminal and the gate of the second normally-off switch device; a normally-on bidirectional switch, by connecting the outputs of the first gate driver between the first source terminal and the third source terminal and connecting the outputs of the second gate driver between the second source terminal and the fourth source terminal; or a hybrid bidirectional switch, by connecting the outputs of the first gate driver between the first source terminal and the gate of the first normally-off switch device and connecting the outputs of the second gate driver between the second source terminal and the fourth source terminal.

Example 20. A method of configuring a unidirectional power switch, the method comprising: attaching the unidirectional power switch to a circuit board, the unidirectional power switch including: a normally-on switch device having a normally-on gate, a source, and a drain; a normally-off switch device having a normally-off gate, a source, and a drain, wherein the drain of the normally-off switch device is electrically connected to the source of the normally-on switch device in a cascode configuration; a first source terminal electrically connected to the source of the normally-off switch device; a second source terminal electrically connected to the source of the normally-on switch device; and a drain terminal electrically connected to the drain of the normally-on switch device; and configuring the unidirectional power switch as one of: a normally-off unidirectional switch, by connecting outputs of a gate driver between the first source terminal and the gate of the normally-off switch device; or a normally-on unidirectional switch, by connecting the outputs of the gate driver between the first source terminal and the second source terminal.

As used herein, the terms "having," "containing," "including," "comprising," and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A bidirectional power switch, comprising:
    a normally-on bidirectional switch device having a first normally-on gate, a second normally-on gate, a first source, and a second source;
    a first normally-off switch device having a normally-off gate, a source, and a drain;
    a second normally-off switch device having a normally-off gate, a source, and a drain, wherein the drain of the first normally-off switch device is electrically connected to the first source of the normally-on bidirectional switch device and the drain of the second normally-off switch device is electrically connected to the second source of the normally-on bidirectional switch device in a cascode configuration;
    a first source terminal electrically connected to the source of the first normally-off switch device;
    a second source terminal electrically connected to the source of the second normally-off switch device;
    a third source terminal electrically connected to the first source of the normally-on bidirectional switch device;
    a fourth source terminal electrically connected to the second source of the normally-on bidirectional switch device;
    a first gate driver connected between the first source terminal and the third source terminal; and
    a second gate driver connected between the second source terminal and the fourth source terminal,
    wherein the bidirectional power switch is configured as a normally-on bidirectional switch.

2. The bidirectional power switch of claim 1, wherein the normally-on bidirectional switch device, the first normally-off switch device, and the second normally-off switch device are integrated in a same GaN semiconductor die.

3. The bidirectional power switch of claim 1, wherein the normally-on bidirectional switch device is disposed in a first die that comprises GaN, the first normally-off switch device is disposed in a second die that comprises GaN or Si, and the second normally-off switch device is disposed in a third die that comprises GaN or Si, and wherein the first die, the second die, and the third die are integrated in a same molded package.

4. The bidirectional power switch of claim 1, further comprising:
    a first diode having an anode electrically connected to the first normally-on gate of the normally-on bidirectional switch device and a cathode electrically connected to the source of first normally-off switch device; and
    a second diode having an anode electrically connected to the second normally-on gate of the normally-on bidirectional switch device and a cathode electrically connected to the source of second normally-off switch device.

5. The bidirectional power switch of claim 4, wherein the normally-on bidirectional switch device, the first diode, and the second diode are integrated in a same GaN semiconductor die.

6. The bidirectional power switch of claim 5, wherein the first normally-off switch device and the second normally-off switch device are integrated in the same GaN semiconductor die as the normally-on bidirectional switch device, the first diode, and the second diode.

7. The bidirectional power switch of claim 5, wherein the first normally-off switch device is disposed in a first Si semiconductor die and the second normally-off switch device is disposed in a second Si semiconductor die, and wherein the GaN semiconductor die, the first Si semiconductor die, and the second Si semiconductor die are integrated in a same molded package.

8. The bidirectional power switch of claim 4, wherein the normally-on bidirectional switch device has a breakdown voltage of 600V or higher, and wherein both the first diode and the second diode have a breakdown voltage of 20V or less.

9. The bidirectional power switch of claim 1, wherein the normally-on bidirectional switch device is a GaN HEMT (high-electron mobility transistor), wherein the first normally-off switch device is a Si power MOSFET (metal-oxide-semiconductor field-effect transistor), and wherein the second normally-off switch device is a Si power MOSFET.

10. The bidirectional power switch of claim 1, further comprising:
    a first gate terminal electrically connected to the normally-off gate of the first normally-off switch device;
    a second gate terminal electrically connected to the normally-off gate of the second normally-off switch device;
    a third gate terminal electrically connected to the first normally-on gate of the normally-on bidirectional switch device; and
    a fourth gate terminal electrically connected to the second normally-on gate of the normally-on bidirectional switch device.

11. A bidirectional power switch, comprising:
    a normally-on bidirectional switch device having a first normally-on gate, a second normally-on gate, a first source, and a second source;

a first normally-off switch device having a normally-off gate, a source, and a drain;

a second normally-off switch device having a normally-off gate, a source, and a drain, wherein the drain of the first normally-off switch device is electrically connected to the first source of the normally-on bidirectional switch device and the drain of the second normally-off switch device is electrically connected to the second source of the normally-on bidirectional switch device in a cascode configuration;

a first source terminal electrically connected to the source of the first normally-off switch device;

a second source terminal electrically connected to the source of the second normally-off switch device;

a third source terminal electrically connected to the first source of the normally-on bidirectional switch device;

a fourth source terminal electrically connected to the second source of the normally-on bidirectional switch device;

a first gate driver connected between the first source terminal and the gate of the first normally-off switch device; and a second gate driver connected between the second source terminal and the fourth source terminal, wherein the bidirectional power switch is configured as a hybrid bidirectional switch.

12. The bidirectional power switch of claim 11, wherein the normally-on bidirectional switch device, the first normally-off switch device, and the second normally-off switch device are integrated in a same GaN semiconductor die.

13. The bidirectional power switch of claim 11, wherein the normally-on bidirectional switch device is disposed in a first die that comprises GaN, the first normally-off switch device is disposed in a second die that comprises GaN or Si, and the second normally-off switch device is disposed in a third die that comprises GaN or Si, and wherein the first die, the second die, and the third die are integrated in a same molded package.

14. The bidirectional power switch of claim 11, further comprising:

a first diode having an anode electrically connected to the first normally-on gate of the normally-on bidirectional switch device and a cathode electrically connected to the source of first normally-off switch device; and a second diode having an anode electrically connected to the second normally-on gate of the normally-on bidirectional switch device and a cathode electrically connected to the source of second normally-off switch device.

15. The bidirectional power switch of claim 14, wherein the normally-on bidirectional switch device, the first diode, and the second diode are integrated in a same GaN semiconductor die.

16. The bidirectional power switch of claim 15, wherein the first normally-off switch device and the second normally-off switch device are integrated in the same GaN semiconductor die as the normally-on bidirectional switch device, the first diode, and the second diode.

17. The bidirectional power switch of claim 15, wherein the first normally-off switch device is disposed in a first Si semiconductor die and the second normally-off switch device is disposed in a second Si semiconductor die, and wherein the GaN semiconductor die, the first Si semiconductor die, and the second Si semiconductor die are integrated in a same molded package.

18. The bidirectional power switch of claim 14, wherein the normally-on bidirectional switch device has a breakdown voltage of 600V or higher, and wherein both the first diode and the second diode have a breakdown voltage of 20V or less.

19. The bidirectional power switch of claim 11, wherein the normally-on bidirectional switch device is a GaN HEMT (high-electron mobility transistor), wherein the first normally-off switch device is a Si power MOSFET (metal-oxide-semiconductor field-effect transistor), and wherein the second normally-off switch device is a Si power MOSFET.

20. The bidirectional power switch of claim 11, further comprising:

a first gate terminal electrically connected to the normally-off gate of the first normally-off switch device;

a second gate terminal electrically connected to the normally-off gate of the second normally-off switch device;

a third gate terminal electrically connected to the first normally-on gate of the normally-on bidirectional switch device; and a fourth gate terminal electrically connected to the second normally-on gate of the normally-on bidirectional switch device.

* * * * *

UNITED STATES PATENT AND TRADEMARK OFFICE
CERTIFICATE OF CORRECTION

| | | |
|---|---|---|
| PATENT NO. | : 12,057,828 B2 | Page 1 of 1 |
| APPLICATION NO. | : 17/961216 | |
| DATED | : August 6, 2024 | |
| INVENTOR(S) | : K. Leong et al. | |

It is certified that error appears in the above-identified patent and that said Letters Patent is hereby corrected as shown below:

In the Claims

Column 14, Line 18 (Claim 4, Line 6), please change "of first" to -- of the first --.

Column 14, Line 22 (Claim 4, Line 10), please change "of second" to -- of the second --.

Column 15, Line 44 (Claim 14, Line 6), please change "of first" to -- of the first --.

Column 16, Line 2 (Claim 14, Line 10), please change "of second" to -- of the second --.

Signed and Sealed this
Fifteenth Day of October, 2024

Katherine Kelly Vidal
*Director of the United States Patent and Trademark Office*